(12) United States Patent
Takano et al.

(10) Patent No.: US 6,399,926 B2
(45) Date of Patent: Jun. 4, 2002

(54) HEAT-TREATING APPARATUS CAPABLE OF HIGH TEMPERATURE UNIFORMITY

(75) Inventors: Michiro Takano; Osamu Katada, both of Kawasaki (JP)

(73) Assignee: Sigmameltec Ltd., Kawasaki (JP)

( * ) Notice: Subject to any disclaimer, the term of this patent is extended or adjusted under 35 U.S.C. 154(b) by 0 days.

(21) Appl. No.: 09/817,743

(22) Filed: Mar. 27, 2001

(30) Foreign Application Priority Data

| Apr. 3, 2000 | (JP) | 2000-137857 |
| Jul. 21, 2000 | (JP) | 2000-254655 |

(51) Int. Cl.⁷ .............................................. H05B 1/02
(52) U.S. Cl. ........................ 219/497; 219/485; 219/486; 219/121.41; 118/725
(58) Field of Search ................... 219/121.43, 121.41, 219/497, 505, 483, 486; 156/345; 118/724, 725; 307/38–41

(56) References Cited

U.S. PATENT DOCUMENTS

| 4,919,614 A | * | 4/1990 | Kitagawa et al. | 432/259 |
| 5,294,778 A | * | 3/1994 | Carman et al. | 219/385 |
| 6,035,101 A | * | 3/2000 | Sajoto et al. | 392/416 |
| 6,054,688 A | * | 4/2000 | Moschini | 219/494 |
| 6,151,447 A | * | 11/2000 | Moore et al. | 392/418 |
| 6,229,116 B1 | * | 5/2001 | Shirakawa et al. | 219/390 |

FOREIGN PATENT DOCUMENTS

| JP | 7005447 | 1/1995 |
| JP | 7211628 | 8/1995 |
| JP | 7281453 | 10/1995 |

* cited by examiner

Primary Examiner—Mark Paschall
(74) Attorney, Agent, or Firm—Stevens, Davis, Miller & Mosher, LLP

(57) ABSTRACT

A heat treatment apparatus permits manufacture of a high-accuracy resist pattern by reducing a temperature difference within a substrate surface in the transition state of heating or cooling the substrate and the steady state. The heat treatment apparatus includes a thermal plate having a main surface containing a first area on which the substrate is to be placed and a second area surrounding the first area, heat capacity per unit area in the second area of the main surface being smaller than heat capacity per unit area in the first area of the main surface; and a temperature control element for controlling temperature of the thermal plate in accordance with supplied current.

24 Claims, 7 Drawing Sheets

HEAT-TREATING APPARATUS CAPABLE OF HIGH TEMPERATURE UNIFORMITY

BACKGROUND OF THE INVENTION

1. Field of the Invention

The present invention relates to a heat treatment apparatus for heating or cooling a substrate such as a semiconductor, a liquid crystal panel or a photomask thereof.

2. Description of the Related Art

A conventional heat treatment apparatus will first be described, taking up the case of manufacturing a photomask of a semiconductor device, for example, an LSI.

A manufacturing process of a photomask of an LSI now in use generally comprises a step of sputtering a chromium film having a thickness of about 0.1 μm onto a glass substrate having a main surface of a square 152 mm on a side and a thickness of 6.3 mm, a step of coating the substrate with a resist and writing a pattern with electron beams, a step of developing the resist, a step of etching the chromium film, and a step of stripping off the resist.

Along with the recent improvement of integrity and refinement of patterns in the LSI, a chemical amplification type resist providing a high dry etching resistance and giving a high-accuracy resist pattern was developed and industrialization is now in progress. A typical commercial product is SAL601 made by Shipprey Co.

The sensitivity amplification of the chemical amplification type resist is conducted through baking at about 110° C. after a pattern is written with electron beam. This baking is called as PEB (post exposure bake). On this count, a size of the resist pattern after development largely varies as a result of variation of temperature upon baking. In order to reduce variation of the size of the resist pattern, it is required to conduct a heat treatment so as to achieve a uniform temperature in the photomask.

As an apparatus or a method for uniformly baking a substrate, some proposals are disclosed in Japanese Unexamined Patent Application Publications JP-7-5447, JP-7-211628, and JP-7-281453.

Japanese Unexamined Patent Application Publication JP-7-5447 discloses a substrate heating apparatus comprising a heater, a hot plate holding the heater, and a lower case, wherein a liquid is sealed in a space between the heater and the hot plate/the lower case.

Japanese Unexamined Patent Application Publication JP-7-211628 discloses a substrate heating apparatus comprising heating means, a hot plate having a concentric circular recess formed therein, temperature detecting means and temperature adjusting means.

Japanese Unexamined Patent Application Publication JP-7-281453 discloses a substrate heating method comprising the steps of placing a substrate to be heated on a bottom hot plate having a heater, and making close the lower surface of a top hot plate having a heater to the outer periphery of the substrate to be heated so as to heat the substrate from the bottom and top surfaces thereof.

All these proposals have an object to achieve a uniform temperature in the substrate during a steady state at a high temperature of, for example, 110° C.

However, along with improvement of integrity of semiconductor integrated circuits, it has gradually been known that, not only temperature uniformity during a steady state at a high temperature, but also temperature uniformity during a transition state in heating and cooling has an important effect on improvement of accuracy of the pattern size.

In the conventional heat treatment apparatus, the hot plate is larger in size as compared with the substrate. When a thick substrate such as a photomask for semiconductor is mounted and heated on a conventional heat treatment apparatus, heat is supplied also from the portion of the hot plate protruding from the substrate. As a result, a problem is encountered in that temperature of the outer portion of the substrate rises rapidly in transition. Similarly, when cooling a heated substrate, a problem is encountered in that temperature of the outer portion falls rapidly in transition.

Using a conventional heat treatment apparatus comprising a bottom hot plate and a top hot plate, a 152 mm×152 mm square photomask was heated and cooled, and changes in temperature were measured at nine points positioned at intervals of 65 mm in this photomask. The result of measurement is shown in FIGS. 1A and 1B.

FIG. 1A illustrates a time change in average temperature on the nine points in the photomask. In FIG. 1A, the line indicated by reference numeral 21 represents the ramp up characteristics in heating the photomask; the line indicated by reference numeral 22 represents characteristics during a steady state at a high temperature; and the line indicated by reference numeral 23 represents the ramp down characteristics in cooling the photomask.

FIG. 1B shows a time change of the maximum temperature difference among the nine points in the photomask. Because temperature of the outer peripheral rises rapidly in heating, the temperature difference was measured to be 5.5° C. The difference becomes smaller as 0.5° C. during the steady state at the high temperature, but as the temperature of the outer periphery falls rapidly in cooling, the temperature difference was measured to be 8.3° C. When there are large temperature differences among a plurality of points in transition such as in heating and cooling, a problem is caused of the poor size accuracy of patterns.

SUMMARY OF THE INVENTION

To solve the aforementioned problems, the present invention has an object to provide a heat treatment apparatus which reduces a temperature difference within a surface of the substrate in transition of heating and cooling and in a steady state, thus permitting manufacture of a resist pattern of a high accuracy.

An apparatus according to a first aspect of the present invention comprises a thermal plate having a main surface containing a first area on which the substrate is to be placed and a second area surrounding the first area, heat capacity per unit area in the second area of the main surface being smaller than heat capacity per unit area in the first area of the main surface; and a temperature control element for controlling temperature of the thermal plate in accordance with supplied current.

In this apparatus, it should be noted that a portion of the substrate may be placed in the second area of the main surface of the thermal plate.

An apparatus according to a second aspect of the present invention comprises a first thermal plate having a main surface on which the substrate is to be placed; a first temperature control element for controlling temperature of the first thermal plate in accordance with supplied current; at least one second thermal plate arranged along an outer periphery of the first thermal plate via a spacer having a heat conductivity lower than that of the first thermal plate; and at least one second temperature control element for controlling temperature of the at least one second thermal plate in accordance with supplied current.

An apparatus according to a third aspect of the invention comprises a first thermal plate having a main surface on which the substrate is to be placed; a first temperature control element for controlling temperature of the first thermal plate in accordance with supplied current; a first temperature sensor for detecting temperature of a predetermined portion of the first thermal plate to output a detection signal; first current control means for controlling the current to be supplied to the first temperature control element in accordance with the detection signal output from the first temperature sensor; a plurality of second thermal plates arranged along an outer periphery of the first thermal plate via a spacer having a heat conductivity lower than that of the first thermal plate; a plurality of second temperature control elements for controlling temperature of the plurality of second thermal plates in accordance with supplied current, respectively; a plurality of second temperature sensors for detecting temperature of predetermined portions of the plurality of second thermal plates to output detection signals, respectively; and second current control means for individually controlling the current to be supplied to the plurality of second temperature control elements on the basis of the detection signals output from the plurality of second temperature sensors, respectively.

DESCRIPTION OF THE PREFERRED EMBODIMENTS

Figure 1A:
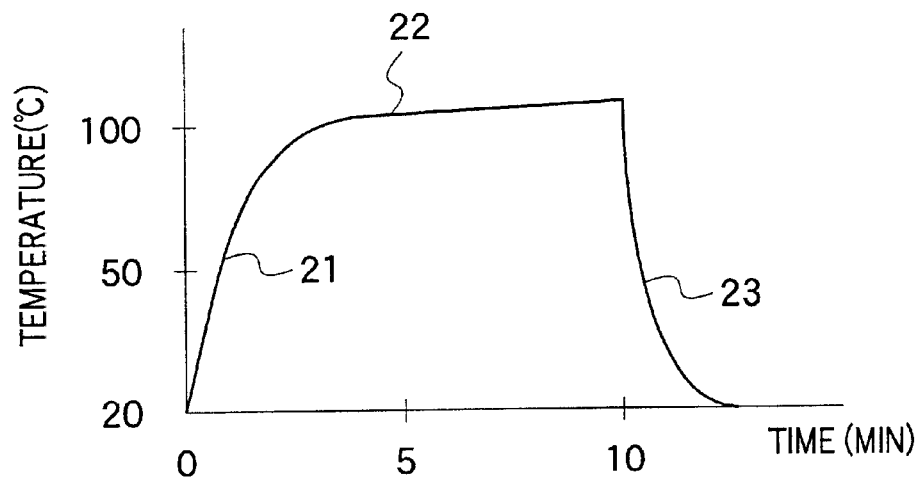
FIGS. 1A and 1B illustrate changes in temperature in heating and cooling a photomask by use of a conventional heat treatment apparatus.
Figure 1B:
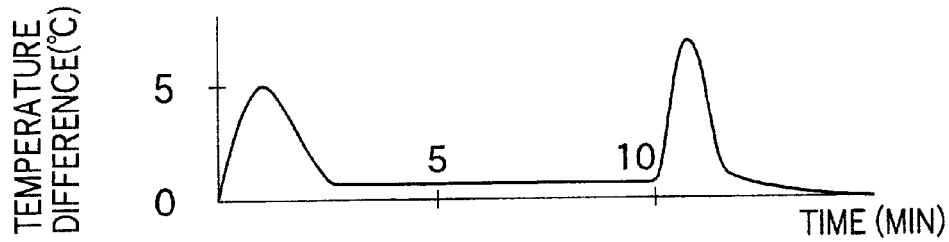

Embodiments of the present invention will now be described with reference to the drawings. The same reference numerals will be assigned to the same components, and description will be omitted to avoid duplication.

Figure 2A:
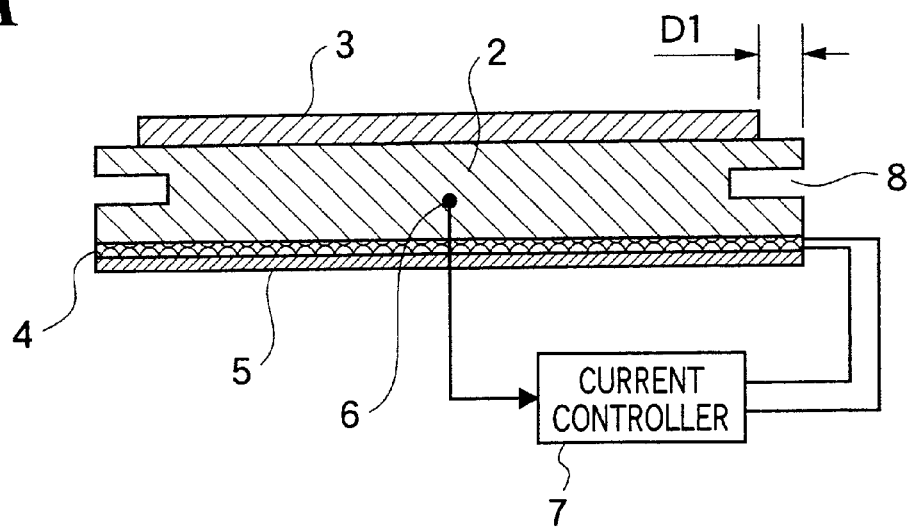
FIGS. 2A and 2B are a vertical sectional view and a plan view, respectively, of a heat treatment apparatus according to a first embodiment of the present invention.
Figure 2B:
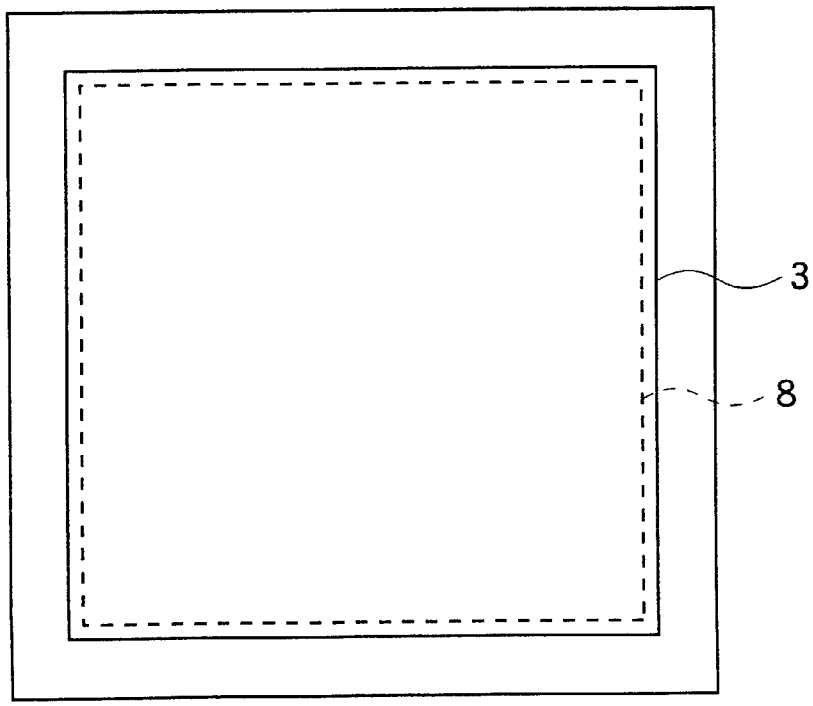

FIG. 2A is a vertical sectional view of the heat treatment apparatus according to a first embodiment of the invention; and FIG. 2B is a plan view thereof. In the following embodiments, the present invention is applied to an apparatus for heating a photomask for an LSI.

As shown in FIG. 2A, this heat treatment apparatus comprises a hot plate 2, a heater 4, a bottom plate 5, a temperature sensor 6, and a current controller 7. The heater 4 is held between the hot plate 2 and the bottom plate 5, and heats the hot plate when current is impressed (supplied). The temperature sensor 6 is arranged in the center portion of the hot plate 2. The temperature sensor 6 detects temperature of the hot plate 2 and issues (outputs) a detection signal. The current controller 7 controls current impressed onto the heater 4 so that the temperature of the hot plate 2 becomes a set temperature of, for example, 110° C. In this embodiment, the current controller 7 sets temperature, whereas the temperature may be set by a temperature setter separated from the current controller.

A 152 mm×152 mm square photomask 3 is mounted on the main surface of the hot plate 2. So that the mechanism for mounting the photomask has a sufficient margin in size, the long side of the hot plate 2 should preferably be longer than the long side of the photomask 3 for each side by 10 mm to 20 mm (D1=10 mm to 20 mm). In this embodiment, D1=15 mm.

At least one groove 8 is formed on the side of the hot plate 2 along the outer periphery thereof. In this embodiment, the groove 8 has a width of 5 mm and a depth of 20 mm. The hot plate 2 has a thickness of about 20 mm. The influence exerted by the heat capacity of the outer periphery of the hot plate 2 on the temperature change of the photomask 3 is larger by the difference in area between the hot plate 2 and the photomask 3. It is therefore possible to improve the temperature uniformity of the photomask 3 in the transition state when a photomask 3 at room temperature is mounted on the hot plate 2, by forming the groove 8 on the side of the hot plate 2 to reduce the heat capacity of the hot plate outer periphery.

In a transition state of heating the photomask 3, the maximum temperature difference among nine points within the surface of the photomask 3, which is 5.5° C. in the conventional heat treatment apparatus, is 3.2° C. in the heat treatment apparatus according to this embodiment. As to the case of cooling a heated photomask 3, the maximum temperature difference among the nine points on the photomask in the transition state of cooling the photomask 3 is 8.3° C. in the conventional heat treatment apparatus, while that in the heat treatment apparatus according to this embodiment is 4.8° C. In any measurement, the amount of protrusion D1 of the hot plate is 15 mm for each side.

Second and third embodiments of the invention will now be described.

Figure 3:
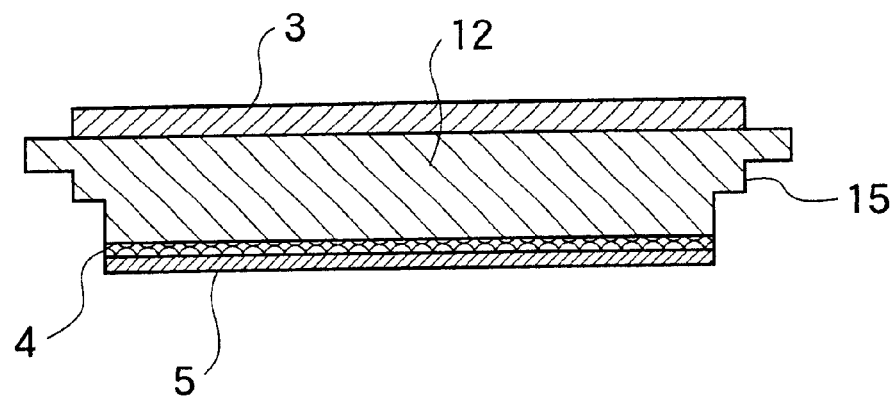
FIG. 3 is a vertical sectional view of a heat treatment apparatus according to second embodiment of the invention.
Figure 4:
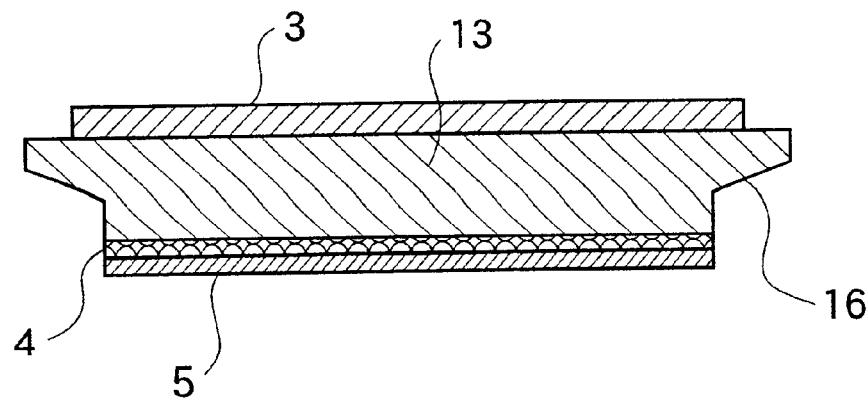
FIG. 4 is a vertical sectional view of a heat treatment apparatus according to a third embodiment of the invention.

FIG. 3 is a vertical sectional view of the heat treatment apparatus according to the second embodiment of the invention; and FIG. 4 is a vertical sectional view of the heat treatment apparatus according to the third embodiment of the invention. In the second and third embodiments, the thickness of the outer periphery of the hot plate is made smaller in place of forming a groove in the hot plate.

In the second embodiment, as shown in FIG. 3, the heat capacity of the outer periphery of the hot plate 12 is reduced by reducing stepwise the thickness of the outer periphery 15 of the hot plate 12. In the third embodiment, on the other hand, as shown in FIG. 4, the heat capacity of the outer periphery of the hot plate 12 is reduced by continuously reducing the thickness of the outer periphery 16 of the hot plate 13. By thus reducing the thickness of the outer periphery of the hot plate, it is also possible to reduce the temperature difference within the substrate surface between the transition state of heating or cooling and the steady state of the substrate, thereby manufacturing a highly accurate resist pattern.

A fourth embodiment of the invention will now be described.

Figure 5A:
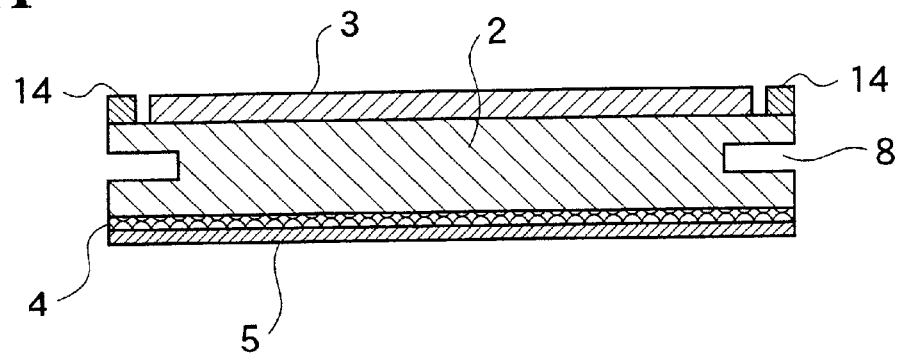
FIGS. 5A and 5B are a vertical sectional view and a plan view, respectively, of a heat treatment apparatus according to a fourth embodiment of the invention.
Figure 5B:
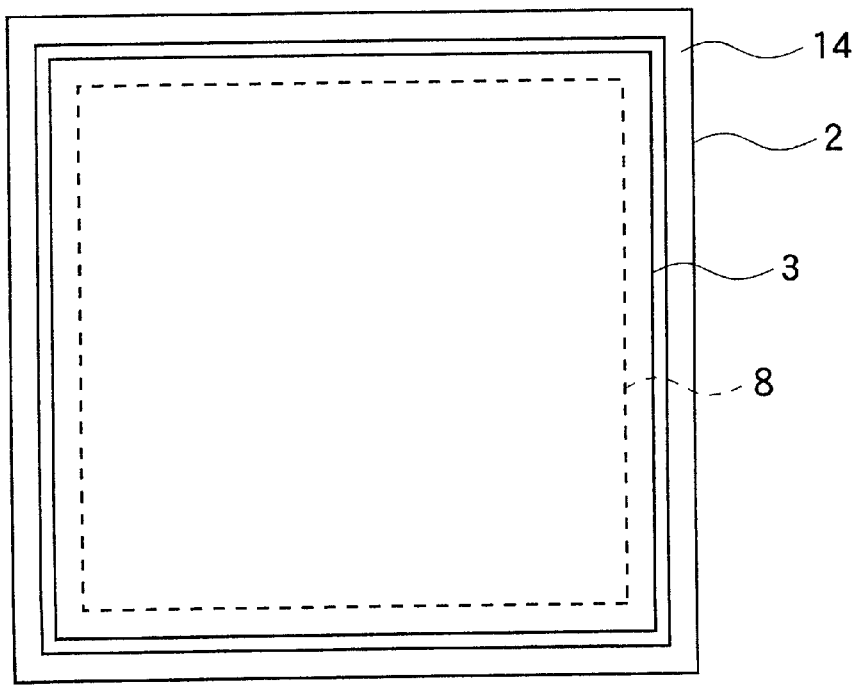

FIG. 5A is a vertical sectional view of the heat treatment apparatus according to the fourth embodiment of the invention; and FIG. 5B is a plan view thereof. In this embodiment, a heat shielding plate is added to the heat treatment apparatus according to the first embodiment.

When heating a thick substrate such as a photomask for semiconductor, heat is radiated from the side of the substrate, and the temperature of the outer periphery of the substrate may sometimes become lower than the temperature of the inner periphery of the substrate. For the purpose of preventing this temperature drop, in this embodiment, as shown in FIGS. 5A and 5B, a heat shielding plate 14 having a height larger than, or equal to, the thickness of the photomask 3 is arranged on the hot plate 2. This improves particularly the temperature uniformity within the substrate in a high-temperature steady state.

In the case where the heat shielding plate 14 is made of metal having high heat conductivity, heat is supplied to the outer periphery of the substrate, and therefore, temperature uniformity becomes wrong in the transient state. On the other hand, in the case where a resin having low heat conductivity is used as the heat shielding plate 14, quantity of heat supplied to the outer periphery of the substrate can be reduced and also quantity of heat radiated from the outer periphery of the substrate can be reduced, thus permitting improvement of temperature uniformity within the substrate in the transition state and the steady state. Because the hot plate 2 becomes high in temperature, it is desirable to use fluorocarbon polymers or polyimide polymer having a high heat resistance.

When a metal having a high heat conductivity is used as a heat shielding plate 14, temperature uniformity within the substrate in the transition state, similar to that in the first embodiment can be achieved by increasing the groove 8 in size by the increment of the heat capacity brought about by the heat shielding plate 14.

A fifth embodiment of the invention will now be described.

Figure 6A:
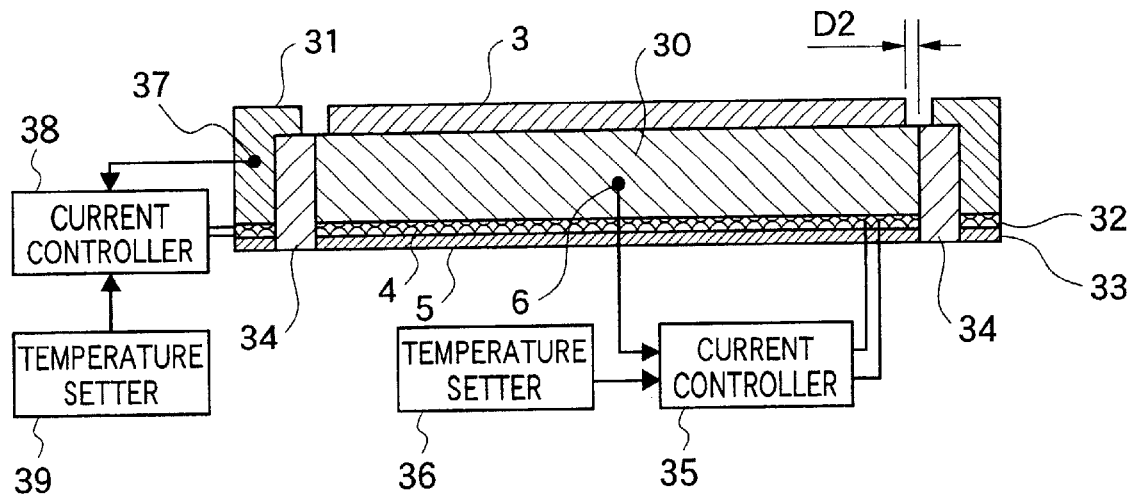
FIGS. 6A and 6B are a vertical sectional view and a plan view, respectively, of a heat treatment apparatus according to a fifth embodiment of the invention.
Figure 6B:
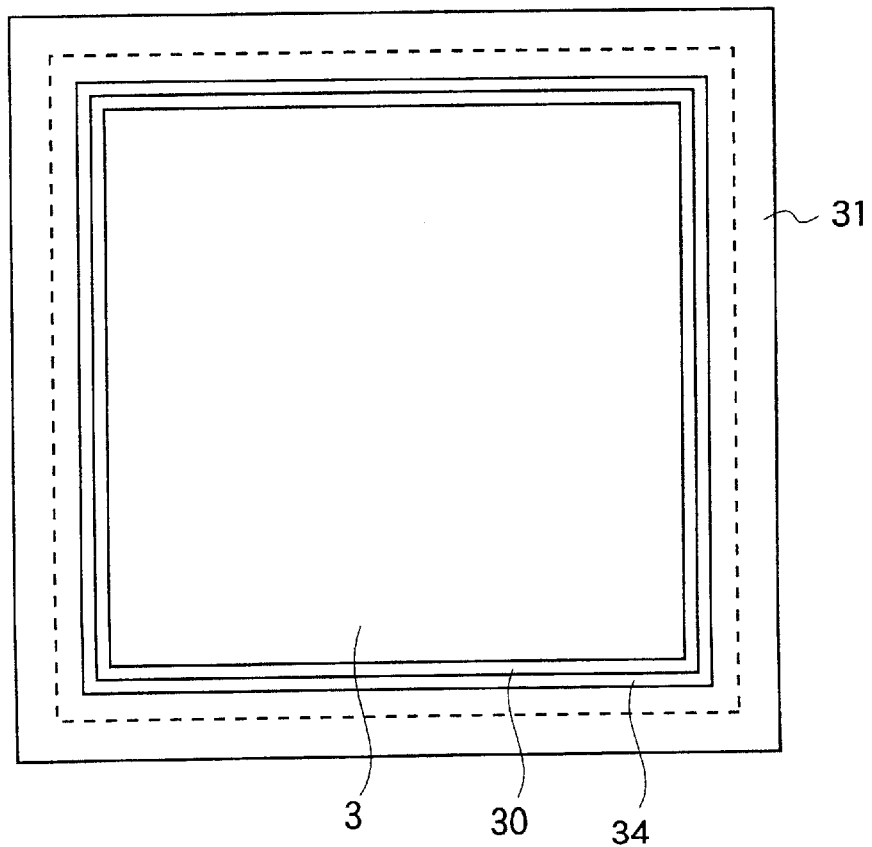

FIG. 6A is a vertical sectional view of the heat treatment apparatus according to the fifth embodiment of the invention, and FIG. 6B is a plan view thereof. In the first to fourth embodiments, the heat capacity per unit area of the substrate outer periphery is reduced to ensure uniform ramp up or ramp down in the substrate temperature in order to correct the thermal imbalance caused by the hot plate becoming larger than the substrate. In this embodiment, on the other hand, a first hot plate has substantially the same size as the substrate, and a second hot plate is arranged around the same, thermally isolated apart from the first hot plate Temperatures within the substrate surface are uniformly increased or decreased by using these two kinds of hot plate.

As shown in FIG. 6A, this heat treatment apparatus comprises a first hot plate 30, a heater 4, a bottom plate 5, a temperature sensor 6, a current controller 35 and a temperature setter 36. This heat treatment apparatus further comprises a second hot plate 31, a heater 32, a bottom plate 33, a spacer 34, a temperature sensor 37, a current controller 37, and a temperature setter 39.

The heater 4 is held between the first hot plate 30 and the bottom plate 5, and when current is impressed, heats the first hot plate 30. A temperature sensor 6 is arranged in the center portion of the first hot plate 30. The temperature sensor 6 detects temperature of the first hot plate 30, and issues a detection signal. The current controller 35 controls current impressed onto the heater 4 on the basis of the detection signal issued from the temperature sensor 6 so that the first hot plate 30 has a temperature set in the temperature setter 36 such as 110° C.

The side of the first hot plate 30 is thermally isolated by the spacer 34, and a second hot plate 31 is arranged outside the spacer 34. The longer side of the first hot plate 30 should preferably be slightly longer than that of the photomask 3 by 0.5 mm to 3 mm for each side (D2=0.5 mm to 3 mm). In this embodiment, D2=2 mm. Even in such a case, the mechanism for mounting the photomask 3 can have a sufficient margin by making the upper surface of the spacer 34 have the same level as the upper surface of the first hot plate 3.

The second hot plate 31 is used for heating the side surface of the photomask 3. The heater 32 is held between the second hot plate 31 and the bottom plate 33, and when current is impressed, heats the second hot plate 31. A temperature sensor 37 is arranged in a predetermined portion of the second hot plate 31. The temperature sensor 37 detects temperature of the second hot plate 31 and issues a detection signal. The current controller 38 controls current impressed onto the heater 32 so that the temperature of the second hot plate 31 becomes a temperature set by the temperature setter 39 such as 112° C.

In this embodiment, the second hot plate 31 prevents the side surface of the photomask 3 from being cooled, and improves the temperature uniformity of the entire surface of the photomask 3. Because the first hot plate 30 and the second hot plate 31 are separately and independently arranged, it is possible to control the same to achieve a uniform temperature for the entire surface of the photomask 3 by setting an optimum temperature for each of them. It is appropriate to set the second hot plate 31 at a temperature higher than the temperature of the first hot plate by 1° C. to 2° C.

As the spacer 34, it is desirable to use polyimide polymer or fluorocarbon polymers having a large thermal resistance and a high refractoriness. In this case, when mounting and heating the photomask 3 on the first hot plate 30, heat transfer from the second hot plate 31 to the first hot plate 30 is reduced. It is therefore possible to ensure uniform ramp up in temperature over the entire surface of the photomask 3.

A sixth embodiment of the invention will now be described.

Figure 7A:
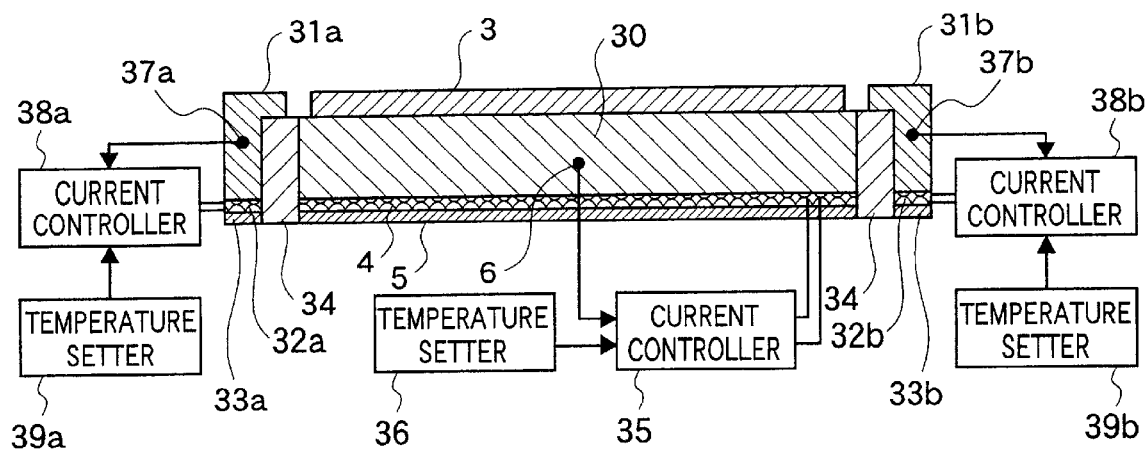
FIGS. 7A and 7B are a vertical sectional view and a plan view, respectively, of a heat treatment apparatus according to a sixth embodiment of the invention.
Figure 7B:
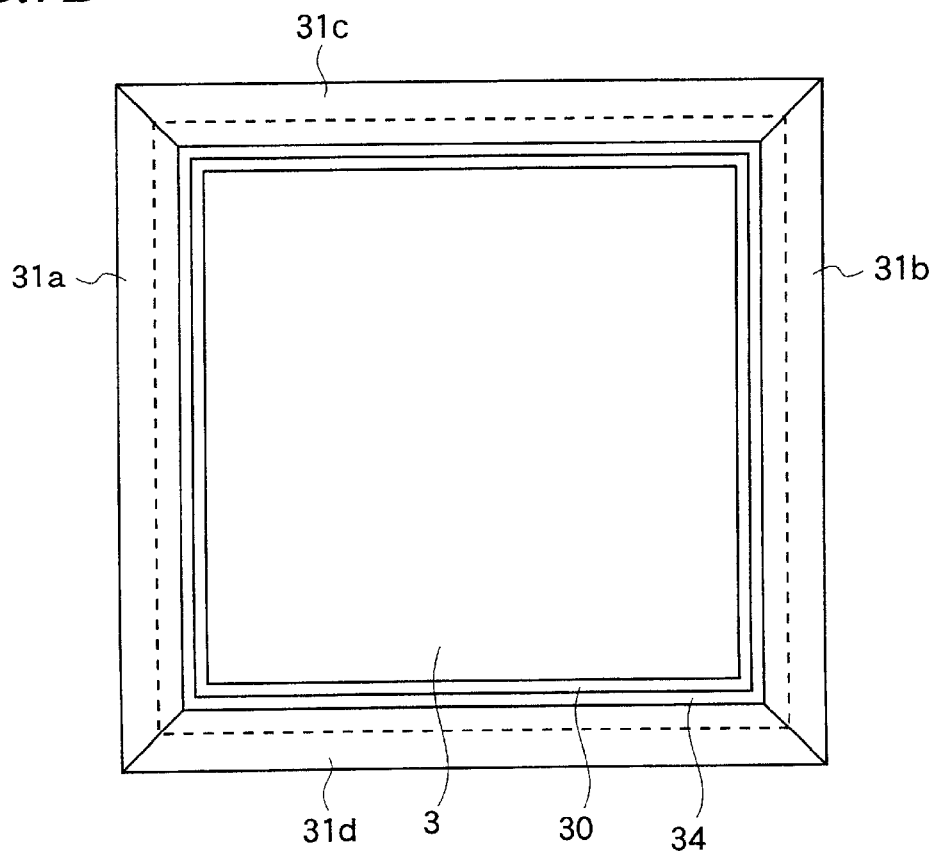

FIG. 7A is a vertical sectional view of the heat treatment apparatus according to the sixth embodiment of the invention, and FIG. 7B is a plan view thereof. As in the fifth embodiment, only one set of the second hot plate 31 and the heater 32 for heating the same is provided for the four sides of the substrate. In this embodiment, however, independent hot plate and heater for each side of the substrate are provided so as to set an optimum temperature for each portion of the substrate and to further improve the uniformity of temperature within the substrate.

As shown in FIG. 7B, in this heat treatment apparatus, a temperature control system comprising four hot plates 31a, 31b, 31c and 31d, and four heaters corresponding to these hot plates is arranged on the outside of the spacer 34. Among these hot plates, the temperature control system of the hot plates 31a and 31b as shown in FIG. 7A will be described here as an example.

The heater 32a is held between the hot plate 31a and the bottom plate 33a, and heats the hot plate 31a when current is impressed. A temperature sensor 37a is arranged in a predetermined portion of the hot plate 31a. The temperature sensor 37a detects temperature of the hot plate 31a and issues a detection signal. The current controller 38a controls current impressed onto the heater 32a so that the temperature of the hot plate 31a becomes that set by the temperature setter 39a, for example 112° C. on the basis of the detection signal issued from the temperature sensor 37a.

Similarly, the heater 32b is held between the hot plate 31b and the bottom plate 33b, and heats the hot plate 31b when current is impressed. A temperature sensor 37b is arranged in a predetermined portion of the hot plate 31b. The temperature sensor 37b detects temperature of the hot plate 31b and issues a detection signal. The current controller 38b controls current impressed onto the heater 32b so that the temperature of the hot plate 31b becomes that set by the temperature setter 39b, for example, 112° C. on the basis of the detection signal issued from the temperature sensor 37b.

It is thus possible to set an optimum temperature for the individual portions of the photomask 3 and further improve the uniformity of temperature within the photomask 3 by providing independent hot plate and heater for each side of the photomask 3.

Alternatively, temperature of the four hot plates 31a, 31b, 31c and 31d may be controlled by means of one set of a temperature sensor, a current controller, and a temperature setter. In this case, the four heaters corresponding to these hot plates are connected to each other in series or in parallel.

A seventh embodiment of the invention will now be described.

Figure 8:
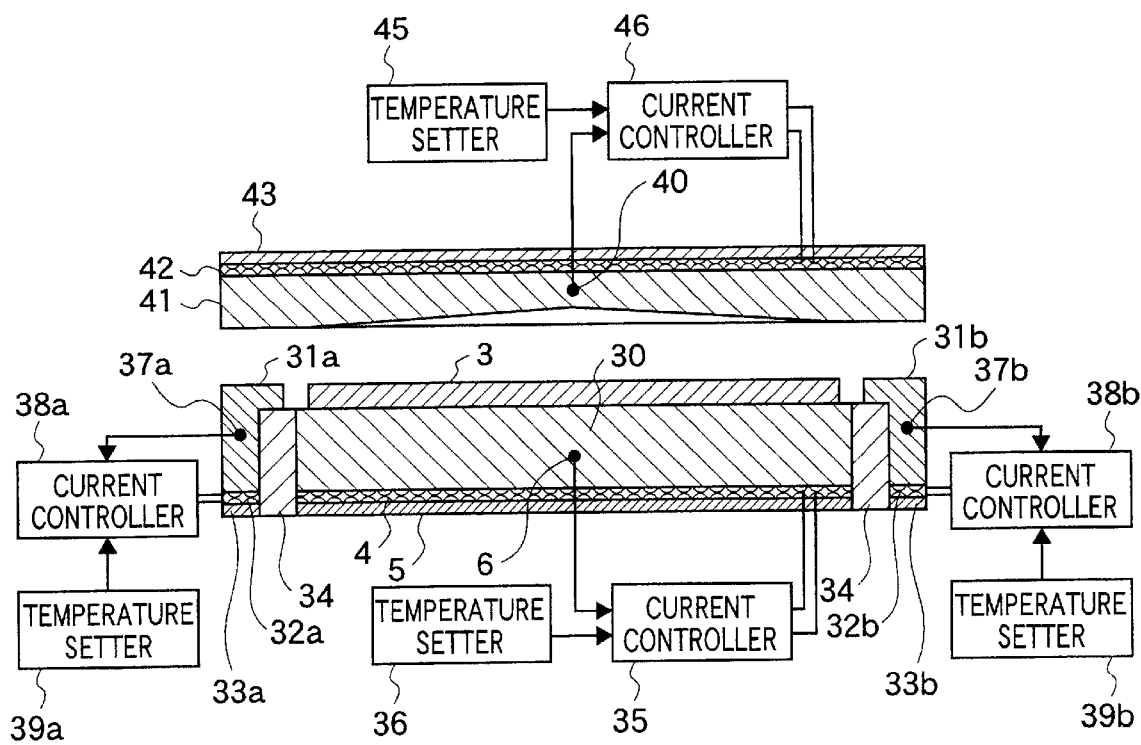
FIG. 8 is a vertical sectional view of a heat treatment apparatus according to a seventh embodiment of the invention.

FIG. 8 is a vertical sectional view of the heat treatment apparatus according to the seventh embodiment of the invention. In this embodiment, an upper hot plate is added to a heat treatment apparatus according to any one of the first to sixth embodiments so as to improve the temperature uniformity especially in the steady state. In FIG. 8, an example is shown in which an upper hot plate is added to the heat treatment apparatus according to the sixth embodiment.

As shown in FIG. 8, in this heat treatment apparatus, the photomask is heated from all directions by using a first hot plate 30 as a lower hot plate, second hot plates 31a, 31b, . . . as side hot plates and a third hot plate 41 as an upper hot plate. A heater 42 is held between the third hot plate 41 and a bottom plate 43, and heats the third hot plate 41 when current is supplied. A temperature sensor 40 is arranged in a predetermined portion of the third hot plate 41. The temperature sensor 40 detects temperature of the third hot plate 41 and outputs a detection signal. The current controller 46 controls current supplied to the heater 42 so that temperature of the third hot plate 41 becomes that set by the temperature setter 45 on the basis of the detection signal output from the temperature sensor 40.

The third hot plate 41 has a concave which faces the first thermal plate 30. The lower surface of the third hot plate 41 may be formed to have a dome shape. Thereby, four corners of the photomask 3 can be heated powerfully so that the temperature uniformity can be improved in the steady state.

According to this embodiment, the maximum temperature difference within the surface of the photomask 3 was measured as 2.5° C. in the transition state of heating and 0.2° C. in the steady state at the high temperature under a condition where temperature of the first hot plate 30 is set to 110° C., temperature of the second hot plates 31a, 31b, . . . is set to 113° C. and temperature of the third hot plate 41 is set to 112° C. On the other hand, according to the conventional heat treatment apparatus, the maximum temperature difference within the surface of the photomask 3 was measured as 5.5° C. in the transition state of heating and 0.5° C. in the steady state at the high temperature under the same condition. Thus, the temperature uniformity is improved in this embodiment.

In the aforementioned embodiments, the description has covered a case where the heat treatment apparatus is to heat the substrate. The present invention is however applicable also to a case of cooling the substrate by using a cooler using an isothermal cooling water jacket or a Peltier device in place of the heater contained in the heat treatment apparatus.

While a photomask for semiconductor has been used as an example for description in the aforementioned embodiments, the invention is applicable also to a semiconductor wafer or a liquid crystal panel requiring high-accuracy heat treatment of the substrate.

According to the present invention, as described above, it is possible to manufacture a high-accuracy resist pattern by reducing the temperature difference, that is, achieving uniform temperature within the substrate surface between the transition state of heating or cooling of substrate and the steady state.

What is claimed is:

1. An apparatus for heat-treating a substrate, comprising:
a thermal plate having a main surface containing a first area on which said substrate is to be placed and a second area surrounding the first area, at least one groove being formed on a side surface along an outer periphery of said thermal plate such that heat capacity per unit area in the second area of said main surface is smaller than heat capacity per unit area in the first area of said main surface; and
a temperature control element for controlling temperature of said thermal plate in accordance with supplied current.

2. An apparatus for heat-treating a substrate, comprising:
a thermal plate having a main surface containing a first area on which said substrate is to be placed and a second area surrounding the first area, said thermal plate including a portion having a thickness which becomes smaller toward an outer periphery such that heat capacity per unit area in the second area of said main surface is smaller than heat capacity per unit area in the first area of said main surface; and
a temperature control element for controlling temperature of said thermal plate in accordance with supplied current.

3. An apparatus according to claim 2, wherein said portion has a thickness which becomes smaller stepwise toward the outer periphery.

4. An apparatus according to claim 2, wherein said portion has a thickness which becomes smaller continuously toward an outer periphery.

5. An apparatus according to claim 1, further comprising:
a temperature sensor for detecting temperature of a predetermined portion of said thermal plate to output a detection signal; and
current control means for controlling the current to be supplied to said temperature control element on the basis of the detection signal output from said temperature sensor.

6. An apparatus according to claim 2, further comprising:
a temperature sensor for detecting temperature of a predetermined portion of said thermal plate to output a detection signal; and
current control means for controlling the current to be supplied to said temperature control element on the basis of the detection signal output from said temperature sensor.

7. An apparatus according to claim 1, wherein said temperature control element is a heater.

8. An apparatus according to claim 2, wherein said temperature control element is a heater.

9. An apparatus for heat-treating a substrate, comprising:
a thermal plate having a main surface containing a first area on which said substrate is to be placed and a second area surrounding the first area, heat capacity per unit area in the second area of said main surface being smaller than heat capacity per unit area in the first area of said main surface;

a heat shielding plate formed in the second area of the main surface of said thermal plate, for intercepting heat radiation from said substrate; and a temperature control element for controlling temperature of said thermal plate in accordance with supplied current.

10. An apparatus according to claim 9, wherein said heat-shielding plate has a thickness not less than that of said substrate.

11. An apparatus according to claim 9, wherein said heat-shielding plate comprises a resin.

12. An apparatus according to claim 1, further comprising a second thermal plate arranged to face said thermal plate; and a second temperature control element for controlling temperature of said second thermal plate in accordance with supplied current.

13. An apparatus according to claim 2, further comprising:

a second thermal plate arranged to face said thermal plate; and a second temperature control element for controlling temperature of said second thermal plate in accordance with supplied current.

14. An apparatus for heat-treating a substrate, comprising:

a thermal plate having a main surface containing a first area on which said substrate is to be placed and a second area surrounding the first area, heat capacity per unit area in the second area of said main surface being smaller than heat capacity per unit area in the first area of said main surface;

a temperature control element for controlling temperature of said thermal plate in accordance with supplied current;

a second thermal plate having a concave which faces said thermal plate; and a second temperature control element for controlling temperature of said second thermal plate in accordance with supplied current.

15. An apparatus for heat-treating a substrate, comprising:

a first thermal plate having a main surface on which said substrate is to be placed;

a first temperature control element for controlling temperature of said first thermal plate in accordance with supplied current;

at least one second thermal plate arranged along an outer periphery of said first thermal plate via a spacer having a heat conductivity lower than that of said first thermal pate; and at least one second temperature control element for controlling temperature of said at least one second thermal plate in accordance with supplied current.

16. An apparatus according to claim 15, wherein said at least one second thermal plate is arranged along an outer periphery of said first thermal plate to face sides of said substrate.

17. An apparatus according to claim 15, further comprising:

a first temperature sensor for detecting temperature of a predetermined portion of said first plate to output a detection signal;

first current control means for controlling the current to be supplied to said first temperature control element on the basis of the detection signal output from said first temperature sensor;

at least one second temperature sensor for detecting temperature of a predetermined portion of said at least one second thermal plate to output a detection signal; and second current control means for controlling the current to be supplied to said at least one second temperature control element on the basis of the detection signal output from said at least one second temperature sensor.

18. An apparatus according to claim 15, wherein said spacer comprises any one of polyimide polymer and a fluorocarbon polymer.

19. An apparatus according to claim 15, wherein said first thermal plate has a longer side longer than that of said substrate by 0.5 mm to 3 mm for each side.

20. An apparatus according to claim 15, further comprising:

a third thermal plate arranged to face said first thermal plate; and a third temperature control element for controlling temperature of said third thermal plate in accordance with supplied current.

21. An apparatus according to claim 20, said third thermal plate has a concave which faces said first thermal plate.

22. An apparatus for heat-treating a substrate, comprising:

a first thermal plate having a main surface on which said substrate is to be placed;

a first temperature control element for controlling temperature of said first thermal plate in accordance with supplied current;

a first temperature sensor for detecting temperature of a predetermined portion of said first thermal plate to output a detection signal;

first current control means for controlling the current to be supplied to said first temperature control element in accordance with the detection signal output from said first temperature sensor;

a plurality of second thermal plates arranged along an outer periphery of said first thermal plate via a spacer having a heat conductivity lower than that of said first thermal plate;

a plurality of second temperature control elements for controlling temperature of said plurality of second thermal plates in accordance with supplied current, respectively;

a plurality of second temperature sensors for detecting temperature of predetermined portions of said plurality of second thermal plates to output detection signals, respectively; and second current control means for individually controlling the current to be supplied to said plurality of second temperature control elements on the basis of the detection signals output from said plurality of second temperature sensors, respectively.

23. An apparatus according to claim 22, further comprising:

a third thermal plate arranged to face said first thermal plate; and a third temperature control element for controlling temperature of said third thermal plate in accordance with supplied current.

24. An apparatus according to claim 23, said third thermal plate has a concave which faces said first thermal plate.

* * * * *